(12) United States Patent
Bergstresser et al.

(10) Patent No.: US 6,296,949 B1
(45) Date of Patent: Oct. 2, 2001

(54) COPPER COATED POLYIMIDE WITH METALLIC PROTECTIVE LAYER

(75) Inventors: Tad Bergstresser, Shaker Heights; Charles A. Poutasse, Beachwood, both of OH (US)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/397,404

(22) Filed: Sep. 16, 1999

(51) Int. Cl.$^7$ ............................ B32B 3/02; B32B 15/20
(52) U.S. Cl. ..................... 428/626; 428/607; 174/256
(58) Field of Search ........................... 428/626, 607; 174/256

(56) References Cited

U.S. PATENT DOCUMENTS

| | | | |
|---|---|---|---|
| 4,337,279 | | 6/1982 | Polak ........................ 427/40 |
| 4,357,395 | * | 11/1982 | Lifshin et al. . |
| 4,431,710 | * | 2/1984 | Lifshin et al. . |
| 4,863,808 | | 9/1989 | Sallo ........................ 428/601 |
| 5,130,192 | | 7/1992 | Takabayashi et al. ........ 428/332 |
| 5,153,050 | * | 10/1992 | Johnston . |
| 5,242,562 | | 9/1993 | Beyerle et al. ............. 204/206 |
| 5,473,118 | | 12/1995 | Fukutake et al. ............ 174/258 |
| 5,681,443 | | 10/1997 | Ameen et al. .............. 205/125 |
| 5,709,931 | * | 1/1998 | Baumgardner et al. . |
| 5,725,937 | * | 3/1998 | Johnston . |
| 5,779,870 | * | 7/1998 | Seip . |
| 6,129,990 | * | 10/2000 | Frater . |
| 6,129,998 | * | 10/2000 | Frater . |

* cited by examiner

Primary Examiner—Deborah Jones
Assistant Examiner—Jason Savage
(74) Attorney, Agent, or Firm—Mark Kusner; Michael A. Centanni

(57) ABSTRACT

A component for use in manufacturing printed circuits, comprising: a laminate that in a finished printed circuit constitutes a functional element, the laminate comprised of: a film substrate formed of a first polymeric material; at least one layer of a flash metal applied to a first side of the film substrate, and at least one layer of copper on the at least one layer of a flash metal, the layer of copper having an essentially uncontaminated exposed surface facing away from the at least one layer of flash metal; and a planar layer of metal that constitutes a discardable element, the layer of metal having an essentially uncontaminated surface that is inert to copper, the laminate being attached to the layer of metal at its borders to define a substantially uncontaminated central zone inwardly of the edges of the sheet that is unjoined at the interfaces.

19 Claims, 2 Drawing Sheets

COPPER COATED POLYIMIDE WITH METALLIC PROTECTIVE LAYER

FIELD OF THE INVENTION

The present invention relates generally to printed circuits, and more particularly, to components used in the manufacturing of printed circuit boards and other articles.

BACKGROUND OF THE INVENTION

A basic component of a printed circuit board is a dielectric layer having a sheet of copper foil bonded thereto. Through a subtractive process that includes one or more etching steps, portions of the copper foil are etched away to leave a distinct pattern of conductive lines and formed elements on the surface of the dielectric layer. Multi-layer printed circuit boards are formed by stacking and joining two or more of the aforementioned dielectric layers having printed circuits thereon.

In recent years, the trend has been to reduce the size of electronic components and provide printed circuit boards having multi-chip modules, etc. This results in a need to increase the number of components, i.e., surface mount components, provided on a printed circuit board. A key to providing a densely populated circuit board is to produce close and fine circuit patterns from the copper. The width and spacing of conductive paths on the printed circuit board are generally dictated by the thickness of the copper on the dielectric layer. For example, if the copper has a thickness of 35 $\mu$m (which is a conventional 1-ounce copper used in manufacturing many printed circuits), exposing the printed circuit board to an etching process for a period of time to remove such a copper thickness will also reduce the width of the side areas of the printed circuit path in approximately the same amount. In other words, the width of the spacing between adjacent circuit lines is basically determined by the thickness of the copper foil on the dielectric layer, as well as the narrowness of the line to be formed. In this respect, as the thickness of the foil decreases below 35 $\mu$m, the ability to physically handle such foil becomes more difficult. There is a minimum thickness of a copper foil sheet that is determined by the ability of the foil manufacturer to handle and transport such sheets. Hence, there is also a limit on achieving close and fine circuit patterns from copper sheets.

In recent years, it has been proposed to use copper-coated polyimides in forming printed circuits. The thickness of the copper on polyimide is generally significantly less than the thickness of traditional copper foil sheet. The thinner copper on the polyimide allows for finer and more closely spaced circuit lines in that the thinness of the copper layer reduces the etching time required to remove unwanted copper. In this respect, it is possible to use copper clad polyimide wherein the copper has a thickness as low as 0.1 $\mu$m (1,000 Å). The thinner copper on the polyimide also finds advantageous application in a semi-additive process. In a semi-additive process, the copper is masked to define a circuit pattern, and copper is plated onto the exposed pattern to build up a circuit. The mask material is removed and a "flash etch" removes the base copper on the polyimide leaving the built-up circuit on the polyimide. Thus, copper on polyimide finds advantageous application in both subtractive and semi-additive processes for forming printed circuits.

As with conventional copper foil, it is important to maintain the surface of the copper on the polyimide free from contamination. It is also important not to bend or flex the polyimide in such a way that cracks may form in the copper layer. In this respect, it is preferable to maintain a copper coated polyimide sheet in a flat planer orientation, i.e. the orientation that will be used within a printed circuit.

The present invention provides a method of protecting the exposed copper layer on a copper-coated polyimide from surface contamination and from undesirable flexing of the laminate.

SUMMARY OF THE INVENTION

In accordance with a preferred embodiment of the present invention, there is provided a component for use in manufacturing a printed circuit. The component is comprised of a laminate that in a finished printed circuit constitutes a functional element, and a planar layer of metal that constitutes a discardable element. The laminate is comprised of a film substrate formed of a first polymeric material, with at least one layer of a tie metal applied to a first side of the film substrate, and at least one layer of copper on the at least one layer of a tie metal. The layer of copper has an essentially uncontaminated exposed surface facing away from the at least one layer of tie metal. The planar layer of metal has an essentially uncontaminated surface that is inert to copper. The laminate is attached to the planar layer of metal at its borders, with the essentially uncontaminated, exposed surface of the at least one copper layer engaging the essentially uncontaminated surface of the planar layer of metal to define a substantially uncontaminated central zone inwardly of the edges of the sheet that is un-joined at the interfaces.

It is an object of the present invention to provide a component having a copper layer for use in manufacturing articles such as printed circuit boards, and a planar layer of metal to protect the surface of the copper layer before and during the manufacturing process.

It is another object of the present invention to provide a component as described above wherein the planar layer of metal is comprised of aluminum.

It is another object of the present invention to provide a component as described above wherein the copper layer has a thickness significantly less than conventional foil sheet.

It is another object of the present invention to provide a component as described above wherein the copper layer finds advantageous application in subtractive and semi-additive circuit forming processes.

It is another object of the present invention to provide a component as described above wherein the copper layer has a uniform thickness and a smooth interface that facilitates good etching, as well as good electrical properties in the resulting circuit.

It is another object of the present invention to provide a component as described above wherein the polymeric layer is dimensionally stable, has a uniform thickness, has good electrical properties and is lasable.

It is another object of the present invention to provide a component as described above wherein the planar layer of metal has sufficient thickness to maintain the laminate in the general planar shape.

These and other objects will become apparent from the following description of the embodiment taken together with the accompanying drawings and the appended claims.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
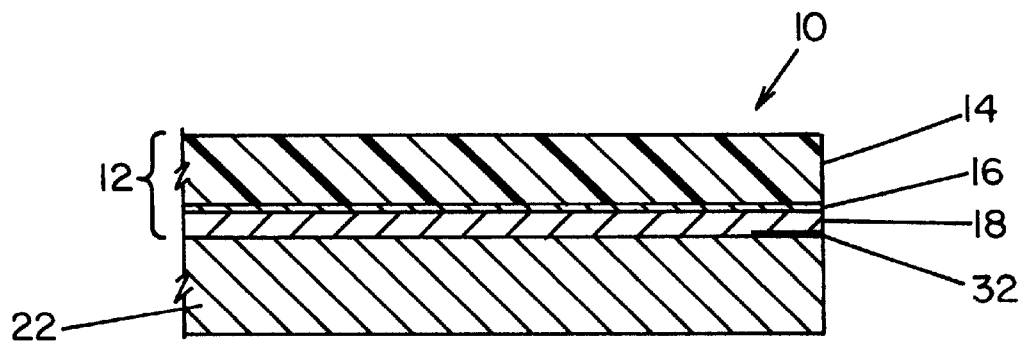
FIG. 1 is an enlarged sectional view of a component used in forming articles such as printed circuit boards, illustrating a preferred embodiment of the present invention.

Referring now to the drawings wherein the showings are for the purpose of illustrating the preferred embodiment of the invention only, and not for the purpose of limiting same, FIG. 1 shows a component 10 for use in manufacturing articles such as printed circuit boards, illustrating a preferred embodiment of the present invention. In the embodiment shown, component 10 is comprised of a laminate 12 that is attached to a metallic substrate 22.

Broadly stated, laminate 12 is comprised of a film substrate 14 formed of a first polymeric material, at least one flash layer 16 of a tie metal (conventionally referred to as a "tie coat") applied to a first side of film substrate 14, and at least one layer 18 of copper on flash layer 16. Laminate 12 is adapted to be a functional element in a finished printed circuit. As indicated above, copper layer 18 would be processed so as to form printed circuit patterns on film substrate 14.

Polymeric film 14 is preferably formed of a polyimide and has a thickness of between 12.5 μm and 125 μm. Specific examples of materials that may form polymeric film 14 include Kapton-E or Kapton-HN (manufactured by I.E. DuPont) Upilex-S or Upilex-SGA (manufactured by Ube) and Apical NP (manufactured by Kaneka).

Tie layer 16 may be formed from metals from the group consisting of chromium, nickel, titanium, aluminum, vanadium, silicon, iron, copper and alloys thereof. Tie layer 16 preferably has a thickness of between 0 Å (none) and 500 Å, and more preferably, between about 50 Å to 300 Å.

Copper layer 18 preferably has a thickness of between about 0.1 μm (1000 Å) and 70 μm. Layer 18 will generally be formed of a flash layer of copper (not shown) onto which a relatively thicker layer of copper is deposited. Layer 18, as referred to hereinafter and as shown in the drawings, is intended to describe the total thickness of the copper layer that is on the tie layer 16. The copper forming metallic layer 18 may be applied by vacuum-metallization, electrodeposition, electroless deposition or combinations thereof. Depending upon the thickness of copper layer 18, the major portion of copper layer 18 is preferably applied by an electrodeposition process or by vacuum metallization. Methods of vacuum metallization include thermal evaporation, sputtering and e-beam deposition. Copper layer 18 has an exposed surface, designated 18a in the drawings that is essentially uncontaminated. As used herein the term "uncontaminated" shall refer to the surface 18a of copper layer 18 being free from dust, grease, oil, resin particles and other like materials that are deleterious when present on the copper to the formation of printed circuit by either a subtractive process or a semi-additive process. Surface 18 a may include surface treatment typically applied to the copper to promote adhesion of a dielectric substrate or to provide other properties and still be "uncontaminated" as used herein. Surface 18a of copper layer 18 may be treated or untreated without deviating from the present invention.

As indicated above, the overall thickness of copper layer 18 may vary between about 0.1 μm (100 Å) and 70 μm. Copper thicknesses at the lower side of this range, i.e., about 0.1 μm, would typically be applied by a vacuum metallization process and find application in a semi-additive process as heretofore described. Copper thicknesses of about 5 μm and above may be applied by an electrodeposition process, or a combined process involving vacuum metallization and electrodeposition. Copper thicknesses of about 5 μm and above may be processed in a number of ways (including a semi-additive process), whereas copper having a thickness of about 18 μm and above, would typically find application in a subtractive process, as described above.

Metallic substrate 22 has a width approximately equal to the width of laminate 12. Metallic substrate 22 is preferably formed of aluminum and has a surface that is cleaned so as to be essentially contaminate-free. Laminate 12 is attached to metallic substrate 22 with a surface of copper layer 18 and the clean surface of metallic substrate 22 facing each other. Laminate 12 is attached to metallic substrate 22 such that interior portions of the facing surfaces are substantially uncontaminated in a region inwardly of the edges of the respective sheets. More specifically, laminate 12 is preferably attached to substrate 22 in the vicinity of the edge portions by an adhesive or adhesive-like material designated 32 in the drawings. Adhesive 32 may include adhesives, resins or tapes. Laminate 12 may also be adhered to metallic substrate 22 by mechanical means such as crimping, deforming and the like. In a preferred embodiment of the present invention, beads of flexible adhesive 32, are applied along the peripheral edges of laminate 12 and metallic substrate 22 to secure same to each other. In some instances, the beads of flexible adhesive 32 may form a continuous strip about the periphery of laminate 12 to hermetically seal the uncontaminated surface of copper layer 18. Such a seal may be desirable to retard oxidation of surface 18a if such surface is not "treated."

The present invention thus provides a component 10 for use in the manufacturing of printed circuit boards or other articles. Component 10 is basically a polymer-supported, thin layer of copper (i.e., comprised of polymeric film layer 14, tie-coat layer 16 and copper layer 18 ) that is protected by metallic substrate 22. In use, polymeric film layer 14 is adapted to be attached to a substrate and copper layer 18 is adapted to be exposed by removal and discarding metallic layer 22. The exposed, uncontaminated copper layer is then utilized in either a subtractive process or a semi-additive process as described above to create a circuit pattern on polymeric film layer 14. As indicated above, the thickness of copper layer 18 formed on polymeric 14 will vary depending upon the process used.

Component 10 is thus suitable for various processes for forming printed circuits. Discardable metallic layer 22 protects copper layer 18 to provide an uncontaminated polymer-supported layer of copper suitable for forming a printed circuit. Polymeric layer 14 provides a suitable surface for attachment to a dielectric substrate. Importantly, the coefficients of thermal expansion (CTEs) for polyimide and for copper are very similar. The like CTEs prevent internal stresses that can cause tearing, warping, or buckling of copper layer 18 during heating and cooling. Further, the surface finish of deposited copper layer 18 may be controlled to provide a smoother finish, that is important in the signal carrying characteristics of circuits formed thereby.

Figure 2:
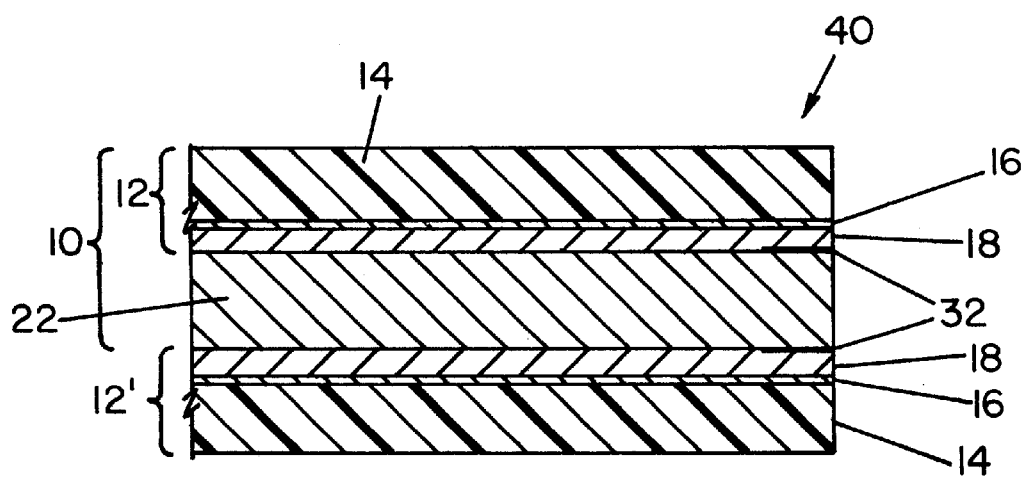
FIG. 2 is an enlarged sectional view of a component used in forming articles such as printed circuit boards, illustrating an alternate embodiment of the present invention.

Referring to FIG. 2, a component 40 illustrating a particular embodiment of the present invention is shown. Component 40 is generally comprised of a component 10 having a second laminate designated 12' attached to the lower surface of substrate 22. Laminate 12' is preferably identical to laminate 12 as heretofore described, and is secured to metallic substrate 22 by an adhesive 32 disposed about the peripheral edges thereof as described above. In this respect it will be appreciated that the lower surface of metallic substrate 22 is cleaned so as to be substantially contamination-free.

FIG. 2 thus provides a component 40 for forming circuit boards or other articles that includes two laminates 12 and 12', each of which may be attached to a substrate as part of a printed circuit board. Removing metallic substrate 22 from laminate 12 and 12' in the course of forming a circuit board exposes the respective copper layers 18 for subsequent processing to form printed circuits thereon.

Figure 3:
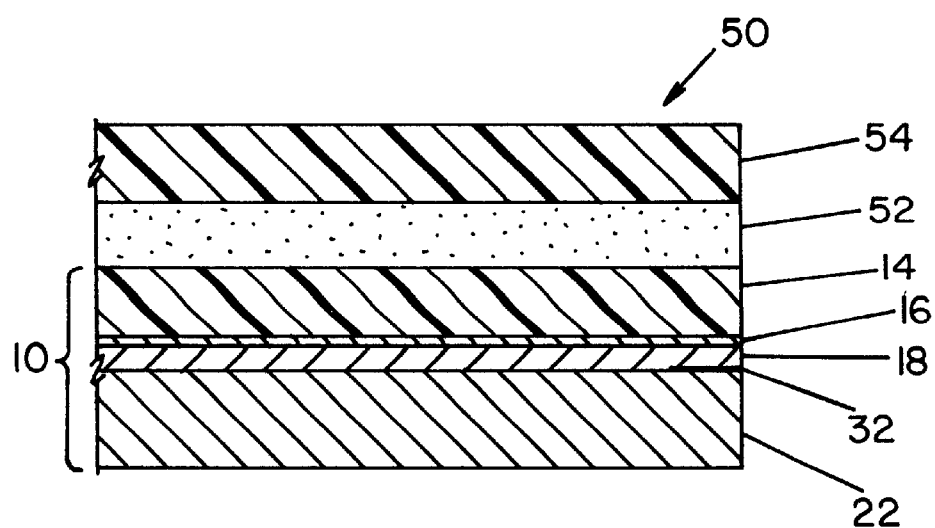
FIG. 3 is an enlarged sectional view of a component used in forming articles such as printed circuit boards, illustrating a second alternate embodiment of the present invention.

Referring now to FIG. 3, component 50, illustrating another embodiment of the present invention as shown. Component 50 is generally comprised of component 10, as heretofore described, having an adhesive layer 52 attached to polymer film 14 and a protective polymeric layer 54 attached to adhesive layer 52. In accordance with this embodiment of the present invention, the overall thickness of adhesive layer 52 is preferably between 12.5 μm and 125 μm. Adhesive 52 is preferably a dimensionally stable adhesive and may be a B-staged or a partially cured resin material or a pressure-sensitive adhesive. A product manufactured and sold by Minnesota Mining and Manufacturing (3M) under the name "High Performance Epoxy Adhesive Bonding Film" finds advantageous use as the adhesive film in the production of the flexible laminate according to the present invention. This product is comprised of an epoxy resin and is available in thicknesses of about 1 to 3 mils. The materials are provided by the manufacturer with removable protective polymer films on both surfaces thereof. The material has the following physical properties as disclosed by the manufacturer.

| Property | Units | | IPC Test |
|---|---|---|---|
| Glass Transition* | ° C. | 180 | |
| CTE | | | |
| 20°–110° C. | ppm/° C. | 60 | |
| 110°–180° C. | | 87 | |
| 180°–250° C. | | 213 | |
| Peel Strength | Lbs./inch | 8 | 2.4.9 |
| Volatile Content | % | 1 | 2.3.37 |
| Moisture Absorption | % | 1.7 | 2.6.2B |
| Chemical Resistance | % | >90 | 2.3.2 |
| Dielectric Constant* | | 3.4 | 2.5.5.3 |
| Dissipation Factor* | | .022 | 2.5.5.3 |
| Dielectric Strength | Volts/mil | 2200 | D-149 |
| Insulation Resistance | Megohms | 1.00E + 06 | 2.6.3.2 |
| Volume Resistivity | Megohms-cm | 5.00E + 07 | 2.5.17 |
| Surface Resistivity | Megohms | 7.00E + 05 | 2.5.17 |
| Solder Float | | Pass | 2.4.13 |
| Low Temperature Flexibility | | Pass | 2.6.18 |
| Flexural Endurance | Cycles | 1787 | 3.7.4 |
| Fracture Toughness | Mpa*m$^{1/2}$ | 0.65 | |
| Modulus | GPa | 3.5 | |

Examples of other adhesives that may find advantageous application in the present invention as adhesive layer 52 include acrylics, epoxies, nitrile rubbers, phenolics, polyamides, polyarylene ethers, polybenzimidazoles, polyesters, polyimides, polyphenylquinoxalines, polyvinyl acetals, polyurethanes, silicones, vinyl-phenolics, urea-formaldehyde and combinations thereof. The adhesive preferably is flame retardant naturally or has a flame retardant material added to it.

Protective film 54 preferably has a thickness of between 12.5 μm and 125 μm. Films that would find advantageous application as a protective film 54 include fluoroplastics, polyester, polyolefin, polyethylene, polypropylene, polyvinyl alcohol, vinyl resin (PVC and PVDC), and mixtures thereof.

Figure 4:
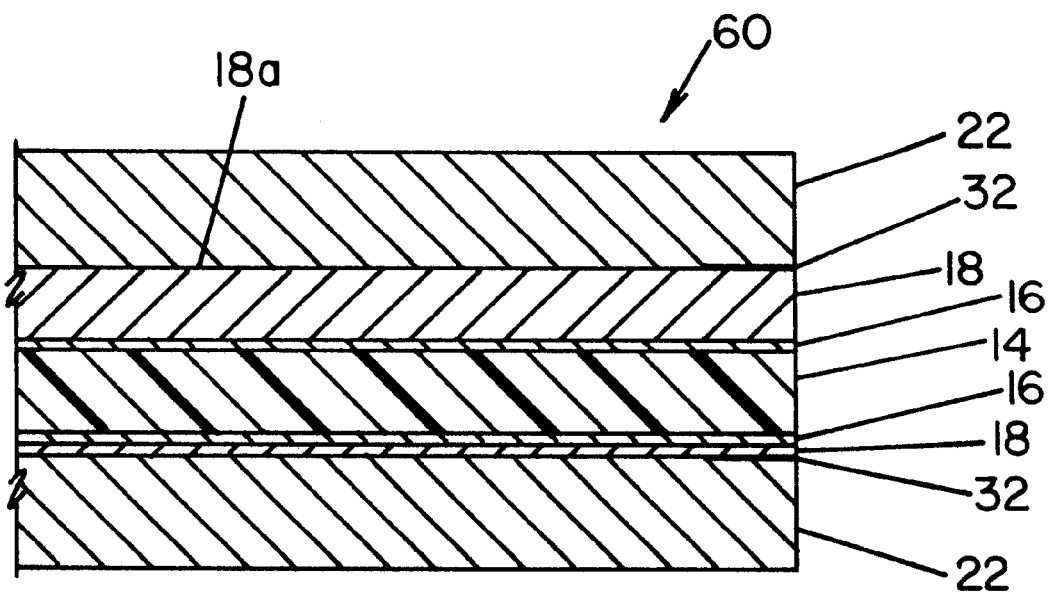
FIG. 4 is an enlarged sectional view of a component used in forming articles such as printed circuit boards, illustrating a third alternate embodiment of the present invention.

Referring now to FIG. 4, a component 60 illustrating another embodiment of the present invention is shown. Component 60 is essentially comprised of a component 10 having a second tie coat 16, a second copper layer 18 and a second metallic substrate 22 applied to polymeric layer 14. In component 60 one copper layer is significantly thinner than the other copper layer 18. The thinner copper layer 18 would typically be used in a semi-additive process for forming printed circuits whereas the thicker copper layer 18 would typically be used in a subtractive process for forming a printed circuit. FIG. 4 thus illustrates a component 60 having copper on both sides thereof that is protected by a metallic substrate 22.

Figure 5:
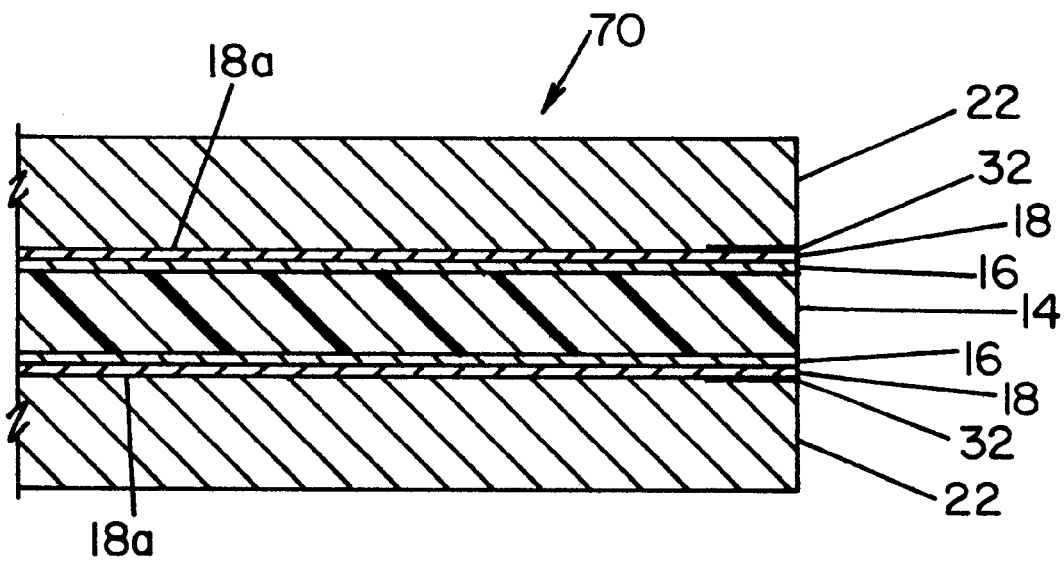
FIG. 5 is an enlarged sectional view of a component used in forming articles such as printed circuit boards, illustrating a fourth alternate embodiment of the present invention.

FIG. 5 illustrates another embodiment of the present invention. In FIG. 5 a component 70 illustrates a variation to component 60 shown in FIG. 4. Component 70 is like component 60 except that both copper layers 18 are relatively thin and would typically be used in a semi-additive process. Component 70 is another example of a laminate structure having protected copper layers 18 on each side of polymeric film 14.

The present invention thus provides a component that may be used in manufacturing printed circuits having the laminate 12 that may be adhered to a substrate and form part of the printed circuit, and a disposable metallic substrate 22, that is ultimately discarded, that protects copper layer 18.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A component for use in manufacturing printed circuits, comprising:
   a) a laminate that in a finished printed circuit constitutes a functional element, said laminate comprised of:
      a film substrate formed of a first polymeric material;
      at least one layer of a tie metal deposited onto a first side of said film substrate, and
      at least one layer of copper electrodeposited onto said at least one layer of a tie metal, said layer of copper having an essentially uncontaminated exposed surface facing away from said at least one layer of tie metal; and
   b) a planar layer of metal that constitutes a discardable element, said layer of metal having an essentially uncontaminated surface that is inert to copper, said laminate being attached to said layer of metal at its borders, with said essentially uncontaminated, exposed surface of said at least one layer of copper engaging said essentially uncontaminated surface of said layer of metal to define a substantially uncontaminated central zone inwardly of the edges of the sheet that is unjoined at the interfaces.

2. A component as defined in claim 1, wherein said first polymeric material is polyimide.

3. A component as defined in claim 2, wherein said planar layer of metal is aluminum.

4. A component as defined in claim 2, wherein said tie metal is selected from the group consisting of chromium, nickel, titanium, aluminum, copper, vanadium, silicon, iron and alloys thereof.

5. A component as defined in claim 4, wherein said tie coat has a thickness of between 0 Å and about 500 Å.

6. A component as defined in claim 5, wherein said copper layer has a thickness between about 0.1 $\mu$m and about 70 $\mu$m.

7. A component as defined in claim 6, wherein said copper layer has a thickness of about 0.2 $\mu$m.

8. A component as defined in claim 6, wherein said polyimide film has a thickness of between about 12.5 $\mu$m and about 125 $\mu$m.

9. A component as defined in claim 1, wherein said laminate is attached to said planar layer of metal by an adhesive applied about the periphery of said laminate.

10. A component as defined in claim 9, wherein said adhesive is a continuous bead applied about the periphery of said laminate that hermetically seals said central zone.

11. A component as defined in claim 1, wherein said first polymeric material is a polyimide, and said component is further comprised of a dimensionally stable adhesive film applied to a second side of said film substrate.

12. A component as defined in claim 11, wherein said adhesive is selected from the group consisting of acrylics, epoxies, nitrile rubbers, phenolics, polyamides, polyarylene ethers, polybenzimidazoles, polyesters, polyimides, polyphenylquinoxalines, polyvinyl acetals, polyurethanes, silicones, vinyl-phenolics, urea-formaldehyde and combinations thereof.

13. A component as defined in claim 12, wherein said adhesive film is an epoxy having a thickness between about 1 mil to about 3 mils.

14. A component for use in manufacturing printed circuits, comprising:

a) a laminate that in a finished printed circuit constitutes a functional element, said laminate comprised of:
a polymer-supported thin layer of copper, said copper being electrodeposited onto said polymer and having a thickness between about 0.1 $\mu$m and about 70 $\mu$m and said polymer having a thickness between about 12.5 $\mu$ and about 125 $\mu$m;

b) a planar layer of metal that constitutes a discardable element, said layer of metal having an essentially uncontaminated surface that is inert to copper, said laminate being attached to said layer of metal at its borders, with said essentially uncontaminated, exposed surface of said at least one layer of copper engaging said essentially uncontaminated surface of said layer of metal to define a substantially uncontaminated central zone inwardly of the edges of the sheet that is unjoined at the interfaces.

15. A component as defined in claim 14, wherein said polymer is a polyimide.

16. A component as defined in claim 15, wherein said polyimide film supports a layer of copper on both sides thereof.

17. A component as defined in claim 16, wherein the layers of copper on each side of said polyimide film have about the same thickness.

18. A component as defined in claim 15, wherein said laminate is to be dependent on said planar layer of metal by an adhesive applied about the periphery of said laminate.

19. A component as defined in claim 18, wherein said adhesive is a continuous bead applied about the periphery of said laminate that hermetically seals said central zone.

* * * * *